(12) United States Patent
De Vos et al.

(10) Patent No.: US 7,657,334 B2
(45) Date of Patent: Feb. 2, 2010

(54) LITHOGRAPHIC APPARATUS AND CONTROL METHOD

(75) Inventors: Youssef Karel Maria De Vos, Lille (BE); Ronald Casper Kunst, Eindhoven (NL); Yin Tim Tso, Eindhoven (NL); Ramidin Izair Kamidi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 453 days.

(21) Appl. No.: 11/227,445

(22) Filed: Sep. 16, 2005

(65) Prior Publication Data

US 2007/0067057 A1    Mar. 22, 2007

(51) Int. Cl.
*G05B 19/18* (2006.01)
*G05B 11/32* (2006.01)
*G06F 19/00* (2006.01)

(52) U.S. Cl. .............................. 700/56; 700/58; 700/59; 700/60; 700/64; 700/70; 700/121

(58) Field of Classification Search .................. 700/56, 700/58, 59, 60, 64, 70, 121
See application file for complete search history.

(56) References Cited

U.S. PATENT DOCUMENTS

| 5,517,097 A * | 5/1996 | Hayashida | 318/568.22 |
| 6,795,163 B2 * | 9/2004 | Finders | 355/53 |
| 6,809,797 B2 * | 10/2004 | Baselmans et al. | 355/52 |
| 7,046,093 B1 * | 5/2006 | McDonagh et al. | 331/16 |
| 7,098,990 B2 * | 8/2006 | Butler | 355/53 |
| 7,289,858 B2 * | 10/2007 | Van Donkelaar et al. | 700/45 |
| 2004/0176861 A1 * | 9/2004 | Butler | 700/63 |

* cited by examiner

*Primary Examiner*—Ronald D Hartman, Jr.
(74) *Attorney, Agent, or Firm*—Pillsbury Winthrop Shaw Pittman LLP

(57) ABSTRACT

A lithographic apparatus includes a movable part and a controller to control a position quantity of the movable part. The controller includes a first controller transfer function and a second controller transfer function. A selector selects the first controller transfer function or the second controller transfer function depending on a state of the movable part. The first controller transfer function may be chosen in a substantially stationary state of the movable part, while in a substantially non-stationary state of the movable part, the second controller transfer function may be chosen.

11 Claims, 3 Drawing Sheets

LITHOGRAPHIC APPARATUS AND CONTROL METHOD

BACKGROUND

1. Field of the Invention

The present invention relates to a lithographic apparatus comprising a movable part and a controller to control a position quantity of the movable part. Further, the present invention relates to a method to control a position quantity of a movable part of a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Usually, a lithographic apparatus comprises a plurality of movable parts such as a substrate table or substrate stage to hold a substrate, a mask table to hold a patterning device, an optical element of a projection system of the lithographic apparatus, a substrate handler to handle the substrate, etc. Usually, such a movable part is to be positioned with a high degree of accuracy. Therefore, a controller is provided to control a position quantity of the movable part, such as a position, a speed, acceleration, a jerk, etc. of the movable parts. The controller may comprise any type of controller, comprising, e.g., a feed back, a feed forward or a combination of a feed back and a feed forward. The controller may, e.g., make use of sensors, which provide a signal representative of the position quantity or of any other quantity, e.g., a quantity derived from the position quantity. Examples of such sensors are position sensors, speed sensors, acceleration sensors, force sensors, vibration sensors, etc. Further, other information may be provided to the control loop, such as a setpoint signal, a feed forward signal, a feed forward error correction signal, etc. A transfer characteristic of the controller, e.g., a gain, a frequency characteristic, or any other transfer characteristic is according to the state of the art commonly optimized to fulfil two goals: at first, a fast response of the controller is to be achieved, to, e.g., shorten a settling time of the movable part. Secondly, a disturbance rejection by the controller is to be maximized, hence reducing an effect of disturbances (such as noise, etc.) on the position quantity. Commonly, a compromise has to be searched, as optimizing the controller for a high disturbance rejection would deteriorate a speed thereof, while on the other hand in case that the controller would be dimensioned such as to obtain a high speed, disturbance rejection would be marginal.

SUMMARY

It is desirable to provide an improved controller and control method for the lithographic apparatus.

According to an embodiment of the invention, there is provided a lithographic apparatus comprising a movable part and a controller to control a position quantity of the movable part, the controller comprising a first controller transfer function and a second controller transfer function, the controller further comprising a selector to select the first controller transfer function or the second controller transfer function depending on a state of the movable part.

In another embodiment of the invention, there is provided a lithographic apparatus comprising a controller to control an output quantity of a process, the controller comprising a first controller transfer function and a second controller transfer function, the controller further comprising a selector to select the first controller transfer function or the second controller transfer function depending on a state of the process.

In a further embodiment, there is provided a method to control a position quantity of a movable part of a lithographic apparatus, the method comprising providing a first controller transfer function and a second controller transfer function, and selecting the first controller transfer function or the second controller transfer function depending on a state of the movable part.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
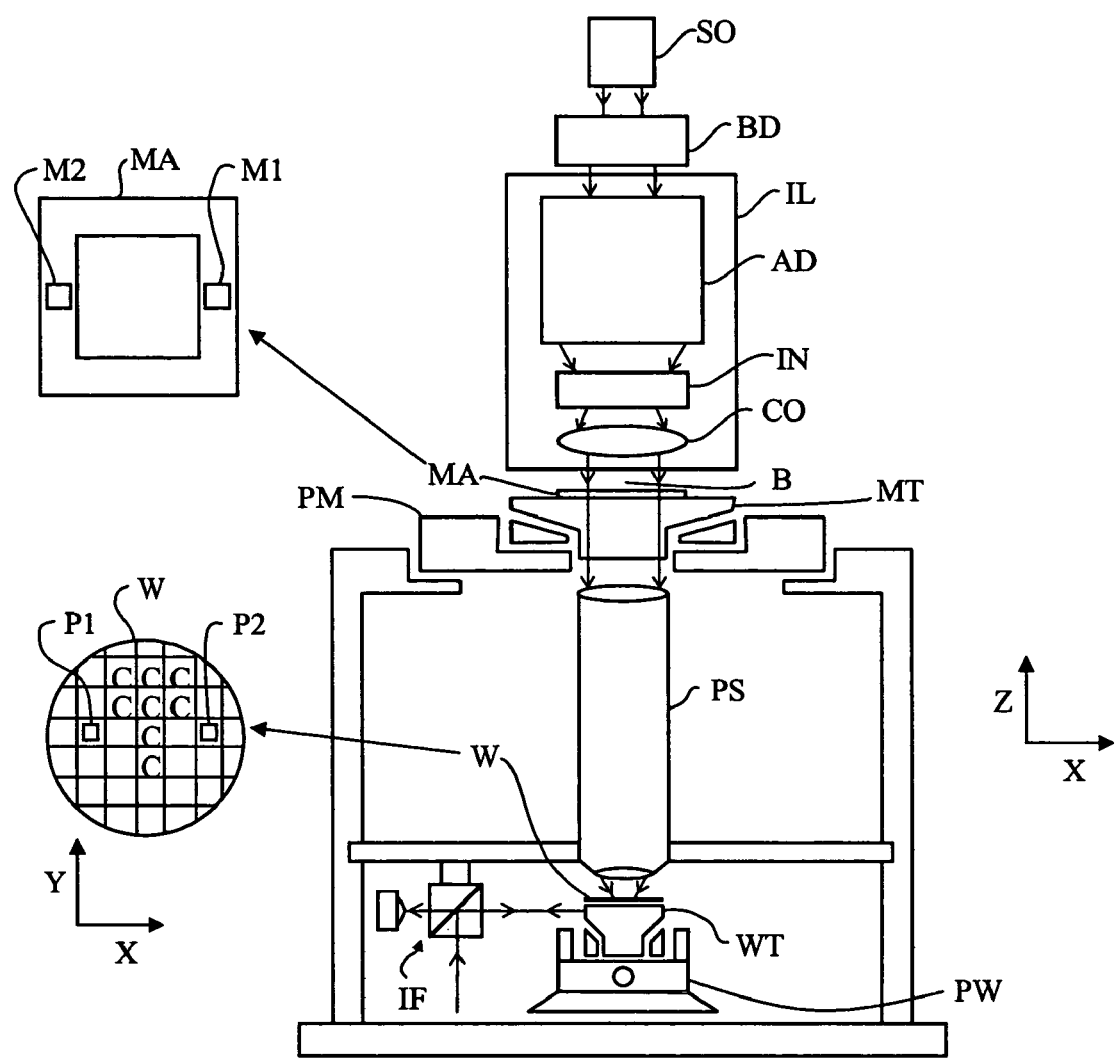
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at once (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilises programmable patterning device, such as a programmable mirror array of a type as referred to above.

Combinations and/or variations on the above-described modes of use or entirely different modes of use may also be employed.

Figure 2:
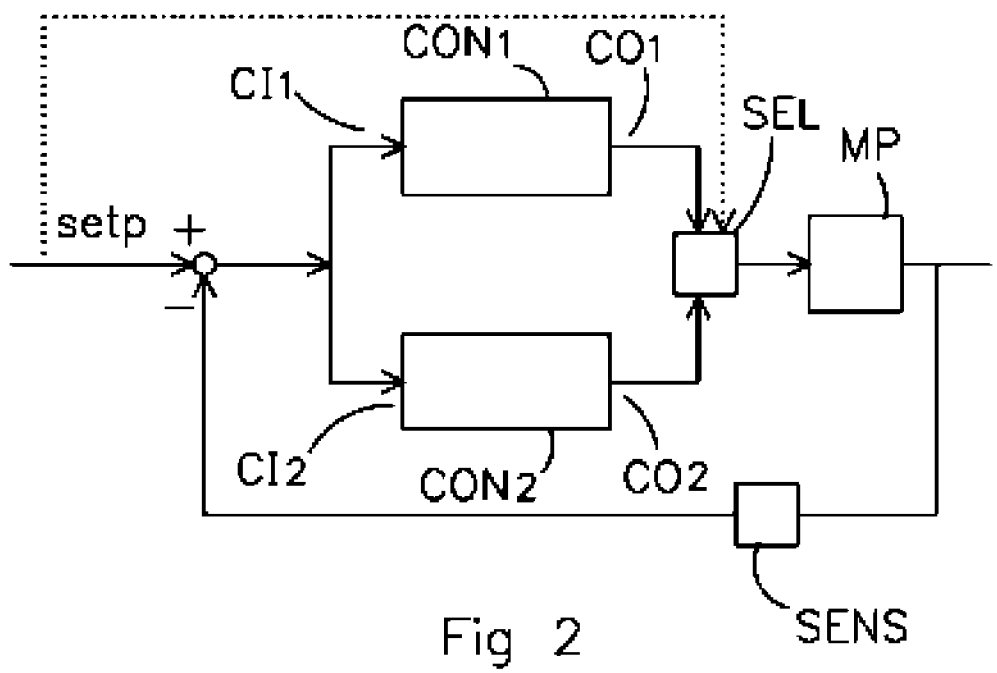
FIG. 2 depicts a block schematic view of a controller and a movable part of a lithographic apparatus according to an embodiment of the invention.

FIG. 2 depicts a control loop for controlling a position quantity of a movable part MP. The control loop comprises a controller C which comprises a first control unit CON1 and a second control unit CON2. An output CO1 of the first control unit CON1 and an output CO2 of the second control unit CON2 are each connected to a respective input of a selector SEL. An output of the selector SEL is connected to a driving input of the movable part MP. The driving input of the movable part may, e.g., comprise an actuator driving input, the actuator to drive the movable part. An output quantity of the movable part, e.g., a positioned quantity thereof is sensed by a sensor SENS. Thus, the output quantity of the movable part is provided to an input of the sensor SENS. An output of the sensor SENS is deducted from a setpoint signal SETP which may be provided by, e.g., a setpoint generator (not shown). A difference between the setpoint signal SETP and the sensor SENS output signal is provided to respective inputs of the first control unit CON1 and the second control unit CON2.

An operation of the control loop as depicted in FIG. 2 will be described below. The controller, selector, movable part and sensor in this embodiment form a closed loop control system. The sensor senses a value of the output quantity of the movable part MP, in this example the positioned quantity which is compared with the setpoint. A difference therebetween is provided to the controller, and via de selector, the movable part is driven. According to an embodiment of the invention, the selector performs a selection between the respective inputs to which a respective output of the first control unit CON1 and the second control unit CON2 is connected. Thereby, the selector performs a selection between the output of the first control unit CON1 and the output of the second control unit CON2, respectively. The first control unit CON1 comprises a first controller transfer function, the first controller transfer function determining a transfer of the first control unit CON1 from the input CI1 of the first control unit CON1 to the output CO1 of the first control unit CON1. Similarly, the second control unit CON2 comprises a second controller transfer function which defines a relationship between the second control unit input CI2 and the second control unit output CO2. The selector SEL thus, by selecting the first control unit output CO1 or the second control unit output CO2, selects the first controller transfer function of the first control unit CON1 resp. the second controller transfer function of the second control unit CON2. A characteristic of the control loop may now be amended, as the first controller transfer function of the first control unit CON1 may be different from the second controller transfer function of the second control unit CON2. As an example, the first controller transfer function of the first control unit CON1 may be determined to achieve a good disturbance rejection. The second controller transfer function of the second control unit CON2 may be determined to achieve a good settling time of the control loop. In this case, the first controller transfer function may be selected by means of the selector when the movable part is in a substantially stationary state, while the second controller function may be selected in case that the movable part is in a substantially non-stationary state. In the substantially stationary state of the movable part, requirements of a settling time will be low, as in that state no or substantially no changes in the position quantity are requested. By now selecting the first controller transfer function, a good disturbance reaction may be achieved. If however the movable part is in a substantially non-stationary state or in more precise terms, if the position quantity of the movable part is in a non-stationary state, a high speed of response hence a low settling time of the control loop may be desired, and thus a selection of the second controller transfer function of the controller CON2 may be beneficial, as the transfer function of the second control unit CON2 may be chosen such as to provide a good speed of response of the control loop resp. a low settling time. In this example, the selector selects the first controller transfer function resp. the second controller transfer function based on the fact whether or not the position quantity of the movable part is in a stationary state. Alternatively, the selector may also select the first controller transfer function resp. the second controller transfer function depending on any other criterion, examples of which will be provided below, however the invention is not limited to these examples.

The movable part may comprise any movable part of the lithographic apparatus, such as the substrate table to hold the substrate, the mask table to hold the patterning device, an optical element, such as a lens, a mirror, a prism, etc. of the projection system, or a substrate handler to handle the substrate. The invention is however not limited to these examples, the movable part may comprise any movable part of the lithographic apparatus. The position quantity may comprise any position-related quantity, such as a position, a velocity, acceleration, a jerk or any other position related parameter. The sensor may comprise any sensor to obtain an output signal which is representative of the position quantity, the sensor may, e.g., comprise a position sensor, a velocity sensor, an acceleration sensor, a jerk sensor, a force sensor, a vibration sensor etc. The controller as well as the selector may be implemented in dedicated hardware, comprising, e.g., analogue and/or digital electronics comprising, e.g., amplifiers, integrators, electronic switches, adders, subtractors, differentiators, etc., however it is also possible that the controller and/or the selector are implemented in part or in full in a form of software, i.e., are implemented by a data processing device such as a microprocessors, microcontroller, digital signal processor or any other data processing device which is provided with suitable software to perform the functions of the controller and selector as described here. In such an embodiment, also the setpoint generator (not shown in FIG. 2) may be implemented in software.

Embodiments of the invention may not only be applied to a movable part. In general, the controller comprising the selector according to an embodiment of the invention may be applied for controlling a position quantity of a movable part, but may in general be applied for controlling any quantity of any process. As an example, the controller may be applied for controlling a temperature of an element of the lithographic apparatus for controlling an intensity of light source, for controlling an attenuation factor of an attenuator such as an optical attenuator or for any other process. In these examples, the sensor may comprise a suitable sensor, e.g., a temperature sensor in case of controlling of a temperature, an optical sensor in case of controlling of an irradiation, optical attenuation, etc., or any other suitable sensor.

Figure 3A:
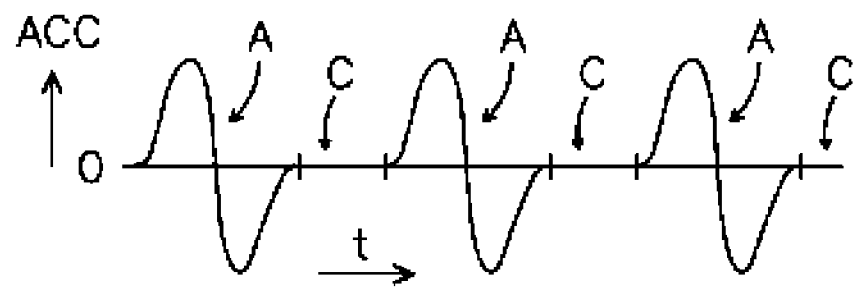
FIG. 3a and 3b depict a graphical view of a course of a position quantity of the movable part versus time.

An operation of the control loop as depicted and described with reference to FIG. 2 will now be described in more detail with reference to FIG. 3a and FIG. 3b. FIG. 3a shows a curve of an acceleration ACC of the movable part MP versus time T. From FIG. 3a it can be seen that the movable part repetitively is in a phase where an acceleration is zero, e.g., phase with a constant velocity or a velocity which his zero, and a phase where the movable part of accelerated and decelerated. Such a pattern of acceleration, deceleration and constant velocity resp. zero velocity may occur, e.g., in a scanning or stepping operation of the lithographic apparatus. In these cases, an irradiation of the substrate (or of a part thereof) may take place in the phase where the speed is constant or zero, while in the phase where the acceleration and deceleration occurs, the projection system resp. the substrate table or any other suitable part, is moved such as to irradiate, e.g., another portion of the substrate in a following phase where the speed is constant or zero. In this example, the movable part may, e.g., comprise a substrate table (or wafer stage), a part of the projection system, a counter balance mass which balances a movement of another part, or any other suitable part. Also, it is possible that the movable part represents an element of the given examples, e.g., an actuator to drive the wafer stage, a prism or other optical element in the projection system, etc. During the phase where the acceleration and deceleration takes place, which in FIG. 3a in indicated by A, the selector selects the second control unit and hence the second controller transfer function, thus providing for a fast response and low settling time of the control loop, thus for a fast settling of the movable part. Then, during the phase where the acceleration is zero, which phase is indicated by C, hence the phase with a constant velocity or a zero velocity the selector selects the first control unit, hence the first controller transfer function to obtain an optimum disturbance rejection. Thus, the controller transfer function is tailored to meet requirements thereto in each of the two phases: in the phase where acceleration and deceleration takes place, a controller transfer function is selected which provides for a good dynamic performance of the control loop, while in the phase where the velocity is constant (including zero) a controller transfer function is chosen to obtain a high disturbance rejection.

Figure 3B:
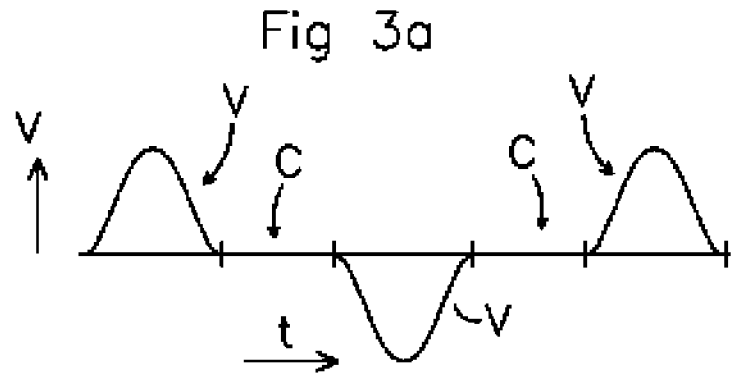

Another example is provided in FIG. 3b, where a velocity V of the movable part is depicted versus time. In a phase indicated V, the movable part has a changing velocity while in the phase indicated C the movable part has a constant velocity (including a zero and a non-zero value). Similarly to FIG. 3a, the second controller transfer function is chosen by the selector in the non-stationary state of the movable part, i.e., the phase V, while the first controller transfer function is chosen by the selector in the substantially stationary state of the movable part, i.e., in this example the state where the velocity is constant, including a zero velocity. Same or similar benefits as described with reference to FIG. 3a apply here.

Figure 4:
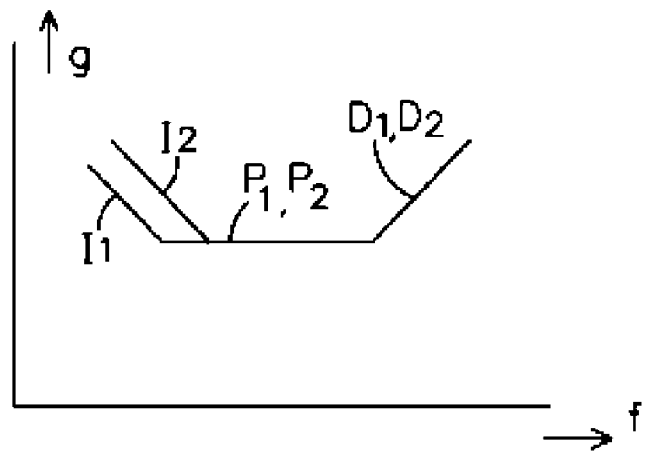
FIG. 4 depicts a frequency diagram of a controller according to an embodiment of the invention.

FIG. 4 depicts a frequency diagram in which is a gain G of the first and second controller transfer functions is depicted versus frequency F. The gain, which thus depicts a magnitude of the respective controller transfer function comprises in this example an integrative part, indicated in FIG. 4 as I1 for the first controller transfer function and the I2 for the second controller transfer function. Further, the controller transfer function comprises a proportional action indicated as P1 for the first controller transfer function and P2 for the second controller transfer function respectively. Also, in this example, the controller transfer functions comprise a differential action, indicated in FIG. 4 as D1 for the first controller transfer function and D2 for the second controller transfer function. Thus, the first controller transfer function as well as the second controller transfer function each comprise a so-called PID controller transfer function. As depicted in FIG. 4, the proportional and differential parts of the first and second controller transfer functions have a same value. A difference between the first and second controller transfer functions in this example is that an integrator gain I2 of the second controller transfer function has a higher value than the integrator gain I1 of the first controller transfer function. By the higher integrator gain I2, the second controller transfer function provides for an improved disturbance rejection (especially of low frequency disturbances) as compared to the first controller transfer function. Contrary thereto, the first controller transfer function provides, due to the lower integrator gain, an improved settling time as compared to the second controller transfer function. Therefore, the first controller transfer function may be selected in a substantially stationary state of the movable part while the second controller transfer function may be selected in a substantially non-stationary state of the movable part.

It is remarked that the terms stationary and non-stationary state may refer to any output quantity, thus the stationary may, e.g., refer to a constant temperature, a constant temperature, a constant velocity, a constant acceleration, a constant illumination, a constant pulse repetition frequency, a constant pulse power, etc., while the term non-stationary state may refer to a state where the examples given previously are substantially non-constant, i.e., show a certain amount of variation, fluctuation, or any other change.

Figure 5:
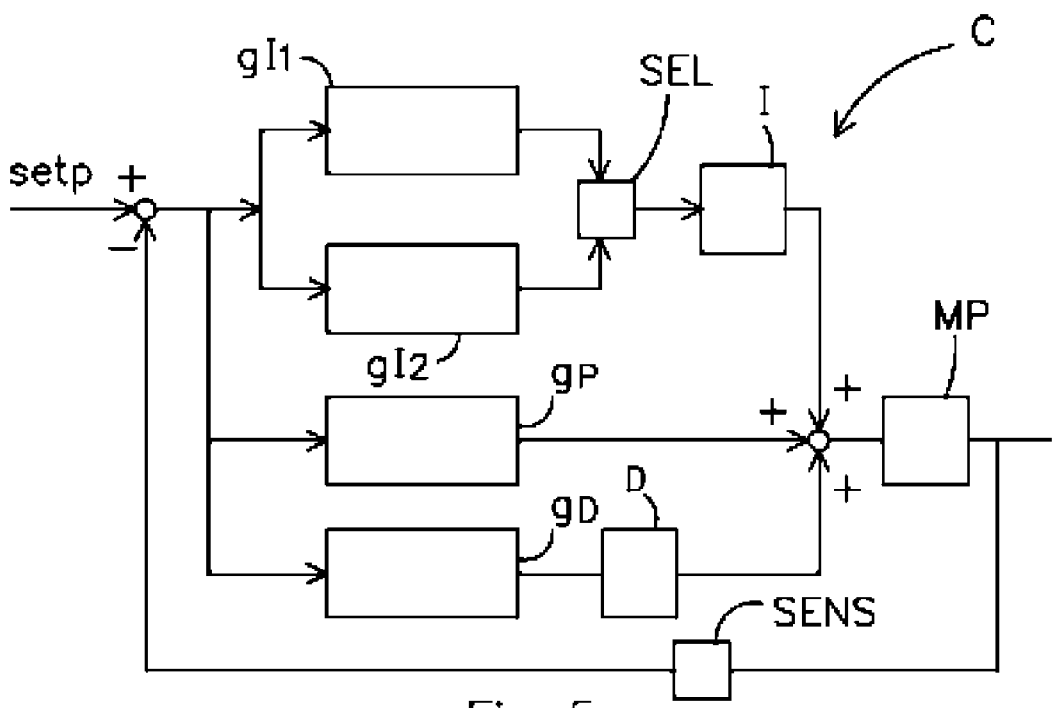
FIG. 5 depicts a block schematic view of a controller and a movable part of a lithographic apparatus according to still another embodiment of the invention.

The first controller transfer function comprising P1, I1 and D1 may be comprised in the first control unit CON1 as depicted in FIG. 2, while the second controller transfer function comprising P2, I2 and D2 may be comprised in the second control unit CON2 as depicted in FIG. 2. However, numerous alternatives are possible. An alternative is depicted in FIG. 5. Similarly as depicted and described with reference to FIG. 2, FIG. 5 shows a movable part MP and a sensor SENS. Also, a setpoint is provided similarly to FIG. 2, a sensor output being subtracted from the setpoint signal. According to the example shown in FIG. 5, the controller comprises a differential path comprising a differential gain GD and a differentiator D, a proportional path comprising proportional gain GP and an integrative path comprising integrator I, selector SEL and integrator gain factors GI1 and GI2. The selector SEL selects between the first integrator gain factor GI1 and the second integrator gain factor GI2. Outputs of the differential path, the proportional path and the integrative path are added to provide an output signal of the controller which is provided as an input to the movable part (or more precisely to an actuator which drives the movable part). Thus, instead of selecting between the first and second control unit as depicted in FIG. 2, the controller according to FIG. 5 provides for a selector which only selects between the elements of the first and second control unit which are different. As the proportional and differential actions in the first and second controllers are identical, only the integrative action differs, the selectors in this example only selects between the different integrative functions. Thus, when the second controller transfer function is to be selected, the selector selects the second integrator gain function GI1 while in case that the first controller transfer function is desired, the selector selects the first integrator gain factor GI1. A benefit of the embodiment as shown in FIG. 5, is that a relatively smooth transition is obtained when switching the selector: as the differential and proportional actions do not require any switching, no transients or other negative effects are to be expected there. Further, in the integrative action in this example only the gain factor GI1, GI2 is selected, while both make use of a same integrator I. Therefore, an output value of the integrator I will not show sudden changes when another one of the two integrator gain factors GI1, GI2 is selected, as in that case at a moment of changing, only an input value to the integrator I changes, thus obtaining a smooth transition at the output of the integrator, and therefore a smooth reaction of the movable part thereto. Thus, shocks, stepwise responses or other phenomena which might occur due to sudden changes such as stepwise changes in an output value of the controller C due to the switching of the selector, may be omitted, thus providing for a smooth transition between the first and second controller transfer functions. It is noted that a similar effect may be achieved when selecting between different differential actions by guiding the input signal of the controller first towards the differentiator, then to an appropriate selector, and only then to the different gain factors.

Figure 6:
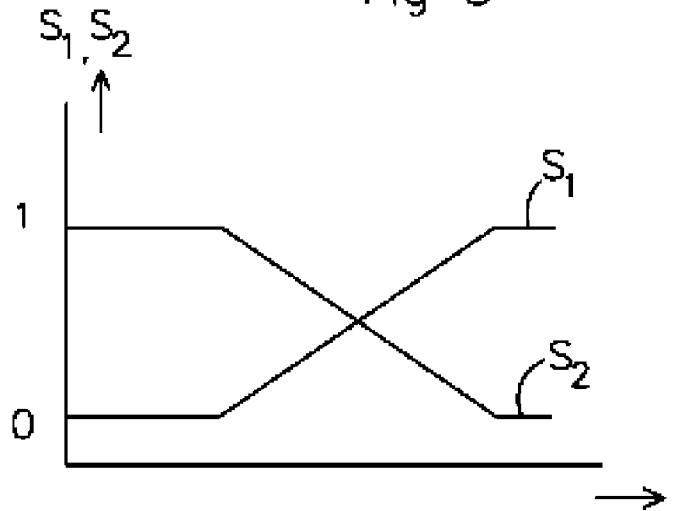
FIG. 6 depicts a time diagram of a detail of a controller according to an embodiment of the invention.

A further embodiment of the invention will now be explained with reference to FIG. 6. According to a further embodiment of the invention, the selector may comprise a weighted selector. The weighted selector by means of a weighting coefficient selects either the first integrator gain function, the second integrator gain function or a combination thereof. FIG. 6 depicts weighting coefficients of the selector SEL versus time T. Initially, in this example weighting coefficient S1 is zero while weighting coefficient S2 is 1. In this example, weighting coefficient S1 represent of the first controller transfer function while weighting coefficient S2 represents a weighting of the second controller transfer function. Thus, initially, the second controller transfer function is selected by the selector. After some time, the second weighting coefficient S2 decreases while simultaneously the first weighting coefficient S1 increases. Thus, an output of the selector at that moment in time comprises a combination of the first and second controller transfer functions. Gradually, a weighting of the first controller transfer function increases while a weighting of the second controller function decreases. Then, the selector selects the first controller transfer function solely as after the transition the first weighting coefficient S1 comprises a value of 1, while the second weighting coefficient S2 comprises a value of zero. The example shown in FIG. 6 provides for a gradual transition, and therefore a smooth transition between the first and second controller transfer functions. Thereby, glitches, steps or other undesired effects which may be obtained when switching between the first and second controller transfer functions may be omitted. The weighting coefficient may be generated by, e.g., a weighting function coefficient generator to, e.g., generate the coefficient value (S) as depicted in FIG. 6, the weighting function coefficient generator may be implemented in hardware and/or in software.

A selection between the first and second controller transfer functions may be provided in various ways: the selector may be driven by a suitable controlling device of the lithographic apparatus, which, e.g., controls (a part of) an operation thereof. The controlling device controlling, e.g., a generation of the setpoint for the control loops as depicted in, e.g., FIG. 2 and FIG. 5. As an example, when the control device provides for a setpoint having, e.g., a constant value, then a stationary state of the movable part may be obtained, and consequently the selector is driven to select an appropriate one of the controller transfer functions, while when the control device controls the setpoint generator such as to provide for an altering, e.g., time varying setpoint, then a non-stationary state of the movable part may be present, the selector then being driven to select the other one of the controller transfer functions. Alternatively, the selector may be driven by the setpoint signal. Thereto, the selector may comprise a setpoint input S1 (as depicted in FIG. 2) to receive the setpoint signal. The selector may determine the state of the movable part from the setpoint signal, thus selecting the appropriate controller transfer function in dependency on the setpoint signal. More particularly, the selector may select the first controller transfer function when the setpoint signal is in a non-stationary state and selects the second controller transfer function when the setpoint signal is in a stationary state, preferably during at least a settling time of the movable part. During the settling time any effects of movement may have settled, and thus by only selecting the second controller transfer function when the setpoint signal has been stationary during at least the settling time of the movable part, it is provided that movements of the movable parts or any other non-stationary condition have resp. has been settled, thus providing for an optimum moment in time to change from the first controller transfer function (non-stationary state) to the second controller transfer function (stationary state), taking account of a settling time of, e.g., the movable part, thus a time which, e.g., the movable part requires to settle upon a change in the setpoint signal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be appreciated by one skilled in the art that modifications may be made to the invention as described without departing from the scope of the claims set out below.

What is claimed is:

1. A lithographic apparatus comprising:
   a movable part, and
   a controller to control a position quantity of the movable part, the controller comprising a first controller transfer function, a second controller transfer function, and a selector to select the first controller transfer function or the second controller transfer function depending on a state of the movable part.

2. The lithographic apparatus according to claim 1, wherein the selector is configured to select the first controller transfer function when the state of the movable part comprises a substantially stationary state of the movable part and the second controller transfer function when the state of the movable part comprises a substantially non-stationary state of the movable part.

3. The lithographic apparatus according to claim 2, wherein the non-stationary state of the movable part comprises an acceleration of the movable part and the stationary state of the movable part comprises a constant velocity of the movable part.

4. The lithographic apparatus according to claim 2, wherein the non-stationary state of the movable part comprises a movement of the movable part and the stationary state of the movable part comprises a stationary position of the movable part.

5. The lithographic apparatus according to claim 1, wherein the selector comprises a setpoint input to receive a setpoint signal of the movable part, and wherein the controller is configured to determine the state of the movable part from the setpoint signal by selecting the first controller transfer function or the second controller transfer function in dependency on the setpoint signal.

6. The lithographic apparatus according to claim 5, wherein the selector is configured to select the first controller transfer function when the setpoint signal is in a non stationary state and to select the second controller transfer function when the setpoint signal is in a stationary state during at least a settling time of the movable part.

7. The lithographic apparatus according to claim 1, wherein the selector comprises a weighted selector and the controller comprises a weighting function coefficient generator to generate a weighting coefficient to drive the weighted selector, and wherein the weighted selector is configured to provide a gradual transition between the first and second controller transfer functions.

8. The lithographic apparatus according to claim 1, wherein the first and second controller transfer functions each comprise a PID controller transfer function, an integrator gain of the second controller transfer function exceeding an integrator gain of the first controller transfer function.

9. The lithographic apparatus according to claim 8, wherein the selector is configured to select the integrator gain of the first and/or second controller transfer function.

10. The lithographic apparatus according to claim 1, wherein the position quantity comprises one of a position, a speed, and an acceleration of the movable part.

11. The lithographic apparatus according to claim 1, wherein the movable part comprises one of a substrate table to hold a substrate, a mask table to hold a patterning device, an optical element of a projection system, and a substrate handler to handle the substrate.

* * * * *